United States Patent
Gay

[11] 3,962,551
[45] June 8, 1976

[54] METHODS AND SYSTEMS FOR PROVIDING STEREO DECODING SIGNALS

[75] Inventor: Michael J. Gay, Geneva, Switzerland

[73] Assignee: Motorola, Inc., Chicago, Ill.

[22] Filed: Mar. 28, 1974

[21] Appl. No.: 455,840

[52] U.S. Cl............................ 179/15 BT; 328/157
[51] Int. Cl.² ...................................... H04H 5/00
[58] Field of Search................ 179/15 BT; 328/162, 328/165, 166, 156, 157, 37, 43, 55; 329/130, 133, 136; 307/261, 221 R; 325/473

[56] References Cited
UNITED STATES PATENTS

| | | | |
|---|---|---|---|
| 3,476,957 | 11/1969 | Duckworth | 328/156 |
| 3,842,211 | 10/1974 | Metro | 179/15 BT |

*Primary Examiner*—Douglas W. Olms
*Attorney, Agent, or Firm*—Michael D. Bingham; Maurice J. Jones, Jr.; Harry W. Weiss

[57] ABSTRACT

The disclosed methods and systems provide a variety of 38 kilohertz signals suitable for use with various stereo decoding circuits. The methods relate to the generation of reference and related rectangular waves and the combination thereof to remove the third harmonic component from the resulting multi-level decoding signal. The disclosed decoding signal generator system structure includes an oscillator, a shift register and a single combiner. The oscillator provides an output signal which is a predetermined multiple of the stereo decoding signal. The shift register derives frequency divided and phase shifted signals from the output signal of the oscillator and the signal combiner to form the stereo decoding signal.

7 Claims, 12 Drawing Figures

METHODS AND SYSTEMS FOR PROVIDING STEREO DECODING SIGNALS

CROSS REFERENCE TO RELATED PATENT AND APPLICATION

The subject matter of the subject application is related to the subject matter of U.S. Pat. No. 3,617,641, entitled "Stereo Multiplexing Demodulator," by James H. Fiet and Francis H. Hilbert, and an application entitled "Stereo Demodulator Circuits and Method of Demodulation" by Michael J. Gay, both of which are assigned to Motorola, Inc.

BACKGROUND OF THE INVENTION

As the number of FM channels and station allocations increase, the amount of distortion due to adjacent channel interference also increases. The local channel spacing in the United States is 200 kilohertz between assigned channels. There is usually a dead channel in between local channels so that they do not interfere with each other.

The problem arises when the listener attempts to receive a weak non-local station adjacent to one or in between two relatively strong local stations. Under these conditions, the local stations have information sidebands which, when converted, fall within the passband of the intermediate frequency (IF) amplifier even though the receiver is tuned to the non-local station. Unfortunately, present day stereo detectors are responsive to such unwanted sidebands.

More particularly, the typical IF passband frequency range is plus or minus 100 to 130 kilohertz. The deviation of a station is restricted by law to plus and minus 75 kilohertz giving a total carrier deviation of 150 kilohertz. Unfortunately, the sidebands resulting from the FM modulation process extend out beyond the 75 kilohertz range. Therefore, an adjacent channel which after conversion is centered 200 kilohertz away from the center of the passband of the IF will have sidebands within the IF passband allowing them to be detected by the receiver's FM detection circuitry.

In the stereo demodulator or demultiplexer circuits that are currently used, a 38 kilohertz square wave is employed in the process which separates the left channel from the right channel. The square wave is used because it has no inherent second harmonic content. Unfortunately, the third harmonic of this stereo decoding signal, which occurs at 114 kilohertz, is only reduced in amplitude from the 38 kHz fundamental by approximately 10 db. This means that the amplitude of the demodulated response to undesired sideband signal at 114 kilohertz from the center of the IF passband will only be about 10 db lower than the response to an equal level of stereo information contained on the desired channel. The demodulated response to the undesired sidebands provides unwanted signals which interfere with the desired stereo signals.

One prior art solution to this problem is the use of a very low distortion 38 kilohertz sine wave as a stereo decoding signal. The basic difficulty with this technique is that the sine wave decoding signal does not allow switching techniques to be employed. However, the demodulation must be done in a linear fashion and is undesirably sensitive to the amplitude of the decoding signal itself. Any noise or amplitude modulation contained on the decoding signal then undesirably appears in the output causing reduction in the signal to noise ratio.

SUMMARY OF THE INVENTION

One object of this invention is to provide methods and systems for generating multi-level decoding signals which have substantially no third harmonic content.

Another object of this invention is to provide methods and systems of generating multi-level stereo decoding signals which utilize switching techniques.

Still another object of this invention is to provide methods and systems for generating multi-level stereo decoding signals that are substantially free of even harmonic components.

The method of generating the multi-level decoding signals includes a step of generating a reference rectangular wave having a predetermined repetition rate and a predetermined phase. A related rectangular wave is generated which also has the predetermined repetition rate but which has a phase that is related to the phase of the reference wave. The reference rectangular wave and the related rectangular wave are either added or subtracted to form the multi-level stereo decoding signal.

The signal generator circuitry which implements this method includes an oscillator, a shift register and a signal combining circuit. The oscillator provides an output signal which is a predetermined multiple of the frequency of the decoding signal. The shift register, which is connected to the output terminal of the oscillator, divides the oscillator output signal by a second predetermined multiple to provide phase related output signals at the output terminals thereof. The signal combining circuit responds to the output signals of the shift register to provide the decoding signals.

DETAILED DESCRIPTION OF THE PREFERRED EMBODIMENTS

Figure 1:
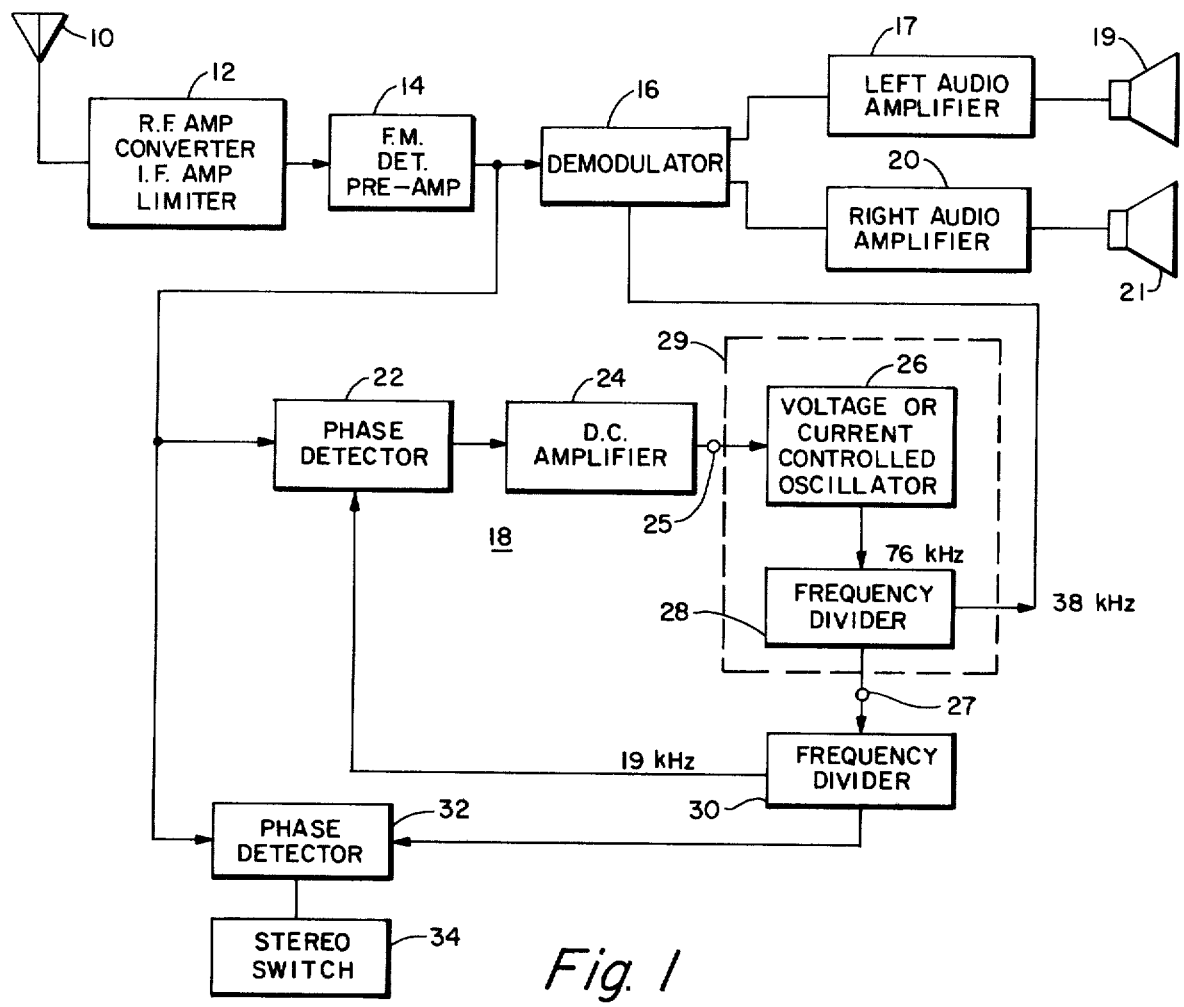
FIG. 1 is a block diagram of a stereophonic receiver which could include the decoding signal generator of the invention.

Referring to FIG. 1, there is shown a stereophonic multiplex receiver. A frequency modulated (FM) carrier wave containing a composite stereo signal comprised of a main channel or sum signal of the left and right audio signals (L + R), a subchannel or difference signal of the left and right audio signals (L − R), which is amplitude modulated on a suppressed subcarrier wave, and a pilot signal having a frequency one half that of the suppressed subcarrier frequency is received by antenna 10. The FM signal is applied to receiver "front end" circuit 12 which includes a RF amplifier, converter, IF amplifier and limiter which may all be of designs well known in the art. The output signal of circuit 12 is then supplied to an FM detector and pre-amplifier circuit 14 where the composite stereo signal modulation is detected.

The recovered composite stereo from the FM detector and pre-amp block 14 is applied to the input terminals of phase detector 22, demodulator 16 and auxiliary phase detector 32. The function of multiplier or demodulator 16 is to separate the left and right channel stereo signal information contained in the output signal of the FM detector. Demodulator 16 performs the separation function in response to a locally generated 38 kilohertz stereo decoding signal supplied thereto by frequency divider 28. The left and right stereo output signals of multiplier 16 are then respectively amplified in left audio amplifier 17 and right audio amplifier 20 and then applied to speakers 19 and 21.

Phase lock loop 18 includes phase detector 22, d.c. amplifier 24, and circuit 29 having voltage or current controlled oscillator 26 and frequency divider 18. Frequency divider 30 has an input terminal 27 which is connected to the output terminal of frequency divider 28, and output terminals connected to the input terminals of phase detectors 22 and 32. The output terminal of phase detector 32 is connected to stereo switch 34.

The 38 kilohertz signal applied to demodulator 16 is derived from the division by a factor of two, performed by divider 28, of a 76 kilohertz signal generated by oscillator 26. Divider 30 divides the 38 kilohertz square wave from divider 28 by a factor of two and provides two 19 kilohertz output signals having quadrature phasing. One of these 19 kilohertz signals is applied to phase detector 22 and the other 19 kilohertz signal, at a phase angle of 90° with respect to the first 19 kilohertz signal, is applied to phase detector 32. Phase detector 32 forms a quadracorrelator which is a phase detector whose output level is responsive to the amplitude of the incoming 19 kilohertz pilot signal. Phase detector 32 establishes an output signal which drives stereo switch 34 in the presence of a stereo signal. The stereo switch provides indicating, muting and disabling functions.

The 38 kilohertz stereo decoding signal developed by frequency divider 28 is a square waveform which does not include the second, or other higher even harmonic components, which could cause spurious noises in the output of the decoder. For example, these noises could be caused by demodulation of the high frequency SCA channel, which is transmitted by some stations to provide background music service. This demodulation would result from the second harmonic component of the 38 kilohertz. This demodulation produces undesired audible tweets and birdies. The prior art square wave stereo decoding signal, however, does have undesired third harmonics.

The requirement then is to generate a stereo decoding signal having no third harmonic component and no even harmonic components. The stereo decoding signal should be of a digital form so that its amplitude values are well defined and, therefore, do not contribute noise problems.

The 38 kilohertz square wave that is used for in prior art detectors has a third harmonic component that is about 10 db below its fundamental component. In accordance with the invention, a second 38 kilohertz waveform having its phase shifted 60° with respect to another 38 kilohertz waveform is generated. This third harmonic components of these signals are 180° out of phase. As a result, these two 38 kilohertz signals can be added to eliminate the third harmonic from the resulting sum signal.

Figure 2:
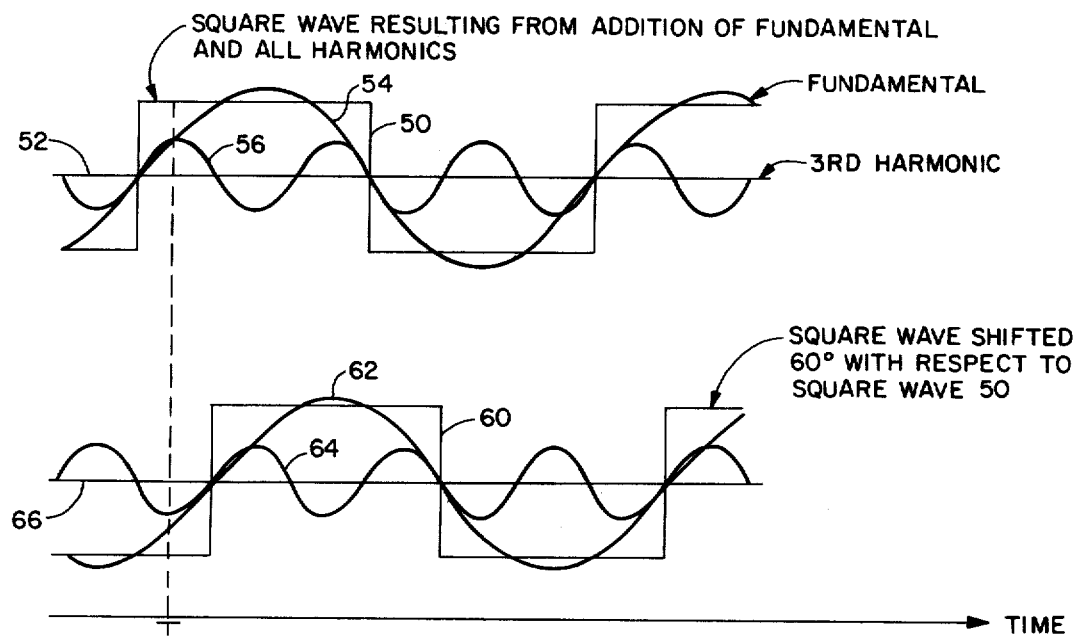
FIG. 2 shows waveforms which are useful in illustrating a third harmonic cancellation technique.
Figure 6:
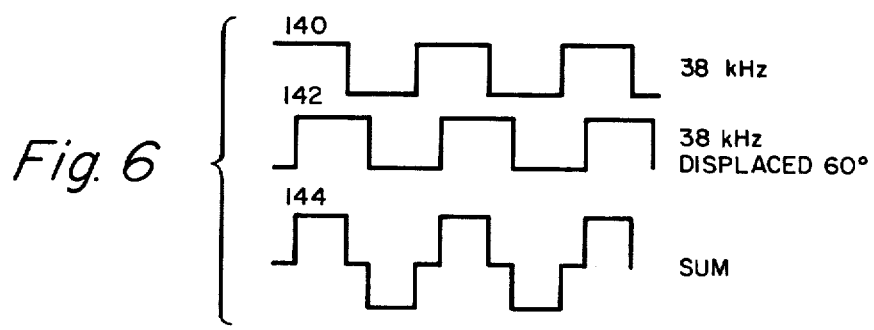
FIG. 6 shows waveforms useful in understanding the operation of FIG. 5 in its summing mode.

More specifically, this technique for eliminating the third harmonic component is demonstrated in FIG. 2. Square wave 50, which will be used as the reference, is comprised of harmonic components including a fundamental sine wave 54 and a third harmonic sine wave 56, plus higher odd harmonics which are not shown. Second square wave 60 is shifted in phase from the original square wave by 60° and its fundamental 62 and third harmonic 64 are shown. At time T, for instance, the third harmonic component 56 of square wave 50 is at its positive peak whereas the third harmonic component 64 of square wave 60 is at its negative peak. By causing these two third harmonic components to have equal magnitudes, they sum to zero to eliminate the third harmonic from the resulting multi-level decoding signal. The waveforms involved and produced by this summing are shown in FIG. 6.

Figure 7:
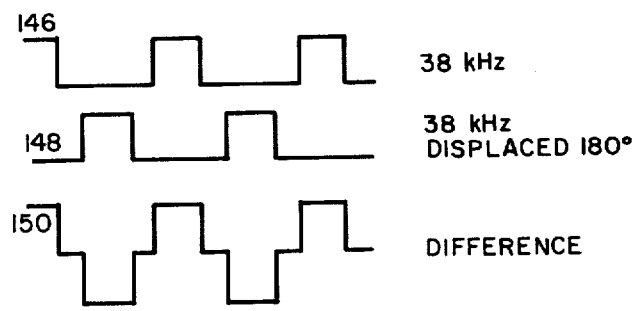
FIG. 7 shows waveforms useful in understanding the operation of the circuit of FIG. 5 in its subtracting mode.

An alternate technique for generating third harmonic free switching waveforms is to generate two asymmetric pulses of 33⅓ percent duty cycle which are 180° out of phase. These two waves are free of third harmonic components but have in phase even harmonic components which are eliminated by subtracting these two waveforms from each other. The waveforms involved and produced by this subtraction are shown in FIG. 7.

Figure 3:
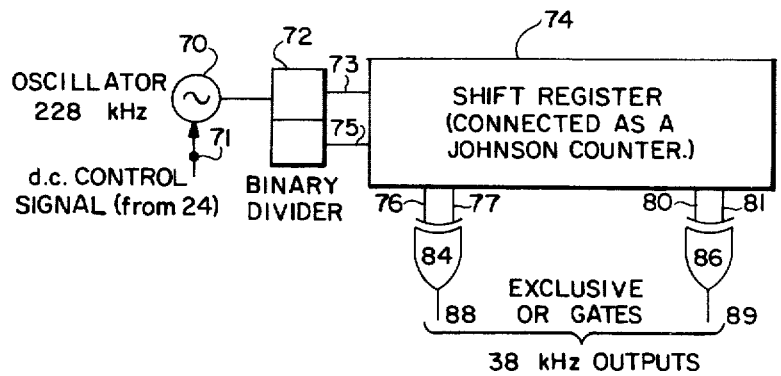
FIG. 3 is a block diagram of a portion of a decoding signal generator of the invention which provides decoding signal components having appropriate phases with respect to each other.
Figure 4:
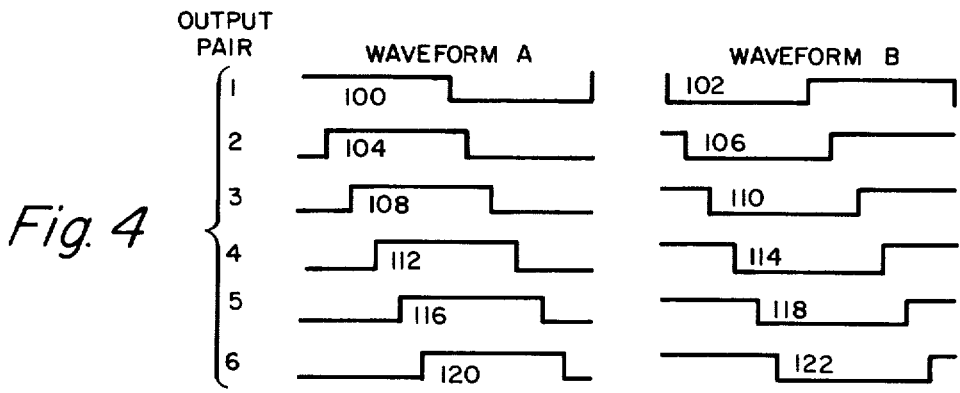
FIG. 4 shows waveforms useful for understanding the operation of the circuit of FIG. 3.

One embodiment of the system of the invention for generating a stereo decoding signal without third harmonic components is shown in FIG. 3 and could be utilized in place of block 29 of FIG. 1. The frequency of 228 kHz oscillator 70 is controlled by the output signal from d.c. amplifier 24 which is applied to control terminal 71. The output terminal of oscillator 70 is connected to and provides a drive signal to the input of binary divider 72. The output signals of binary divider 72 have a repetition rate of 114 kHz and are of opposite phase. These antiphase output signals of binary divider 72 are applied to shift register 74, connected as a Johnson counter, which is well known in the art. The shift register provides 12 possible output signals shown in FIG. 4 as waveforms 100 through 122. Selected pairs of these signals are supplied to exclusive OR gates 84 and 86, which provide the necessary 38 kHz stereo decoding signals at outputs 88 and 89.

Figure 9:
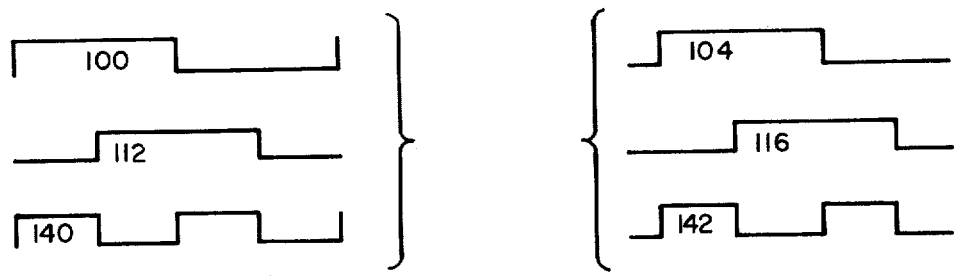
FIG. 9 illustrates waveforms useful in understanding the operation of one of the gates of FIG. 3 under one mode of operation which provides a desired decoding waveform.
Figure 10:
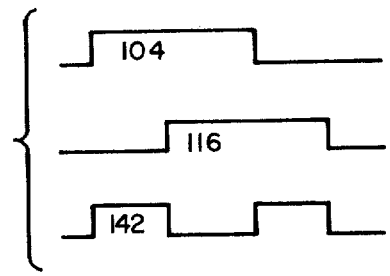
FIG. 10 illustrates waveforms useful in understanding the operation of another gate of FIG. 3 under the one mode operation which provides another desired decoding waveform.

By selecting appropriate combinations of the waveforms 100 through 122, two 38 kHz square waves, of 50 percent duty cycle, shifted 60° with respect to each other can be obtained. For example, as illustrated in FIGS. 9 and 10, a desired pair of 38 kHz stereo decoding signals are obtained from the 19 kHz square wave outputs from shift register 74 by utilizing exclusive OR gates 84 and 86 connected thereto. Selecting waveforms 100 and 112 as the input signals to exclusive OR gate 84, causes a 38 kHz, 50 percent duty cycle output signal 140 at terminal 88, as shown by FIG. 9. The second exclusive OR gate 86 is fed with waveforms 104 and 116 from shift register 74 to generate the second 38 kHz, 50 percent duty cycle, output signal 142 at terminal 89, as shown in FIG. 10. Waveform 142 at terminal 89 is displaced by 60° with respect to waveform 140 which appears at terminal 88.

Figure 11:
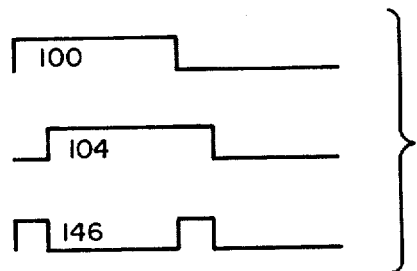
FIG. 11 illustrates waveforms useful in understanding the operation of one of the gates of FIG. 3 under a second mode of operation which provides a desired decoding waveform.
Figure 12:
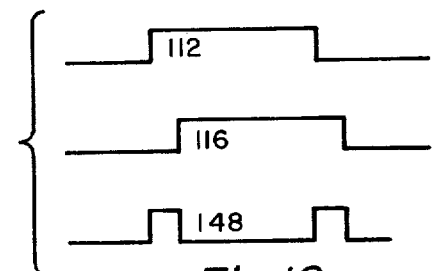
FIG. 12 illustrates waveforms useful in understanding the operation of another gate of FIG. 3 under the second mode of operation which provides a desired decoding waveform.

Alternately, two 38 kHz square waves of 33⅓ percent duty cycle, displaced 180° can be obtained, as illustrated in FIGS. 11 and 12. Selecting waveforms 100 and 104 as the input signals to exclusive OR gate 84, causes a 38 kHz, 33⅓ percent duty cycle output signal 146 at terminal 88, as shown by FIG. 11. The second exclusive OR gate 86 is fed with waveforms 112 and 116 from shift register 74 to generate the second 38 kHz, 33⅓ percent duty cycle, output signal 148 at terminal 89, as shown in FIG. 12. Waveform 148 at terminal 89 is displaced by 180° with respect to waveform 146 which appears at terminal 88.

Figure 5:
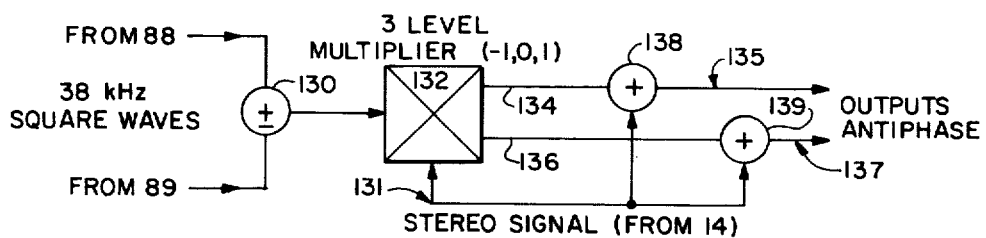
FIG. 5 is a block diagram of a circuit suitable for receiving the output signals of the circuit of FIG. 3 converting them to a three-level decoding signal and then employing them in a stereo decoder.

Referring to FIG. 5, it is seen that the output terminals of the exclusive OR gates 84 and 86 may be connected to the input terminals of summer or subtractor 130 which is connected to one of the input terminals of tri-level multiplier 132. The second input terminal of multiplier 132 receives the output signal from the FM detector 14. The output terminals 134 and 136 of tri-level multiplier 132 are connected to the input terminals of summers 138 and 139, respectively. Summers 138 and 139 also have input terminals which receive the composite stereo signal from FM detector 14.

The 38 kilohertz rectangular waveform obtained from terminals 88 and 89 can be either added or subtracted, depending on the signals selected for application to the OR gates, to provide the stereo decoding signals. Summer or subtractor 130 is arranged to provide the appropriate function. More particularly, if the 38 kilohertz rectangular waveforms are of the form shown in FIG. 6 as waveforms 140 and 142, it is the function of summer 130 to add them together to provide the resultant stereo decoding waveform shown as 144. However, if the 38 kilohertz rectangular waveforms are of the form shown in FIG. 7 as waveforms 146 and 148, subtractor 130 must then provide the difference between them shown as stereo decoding waveform 150. Incidentally, waveforms 144 and 150 are identical in nature.

The composite stereo signal from FM detector 14 is then multiplied by the stereo decoding signal in tri-level multiplier 132 to provide the differential subchannel information signals at output terminals 134 and 136. Summers 138 and 139 combine the subchannel information with the composite stereo signal from detector 14 to provide the left and right channel audio signals at output terminals 135 and 137. These signals can be amplified by amplifiers 17 and 20 of FIG. 1, for instance.

Figure 8:
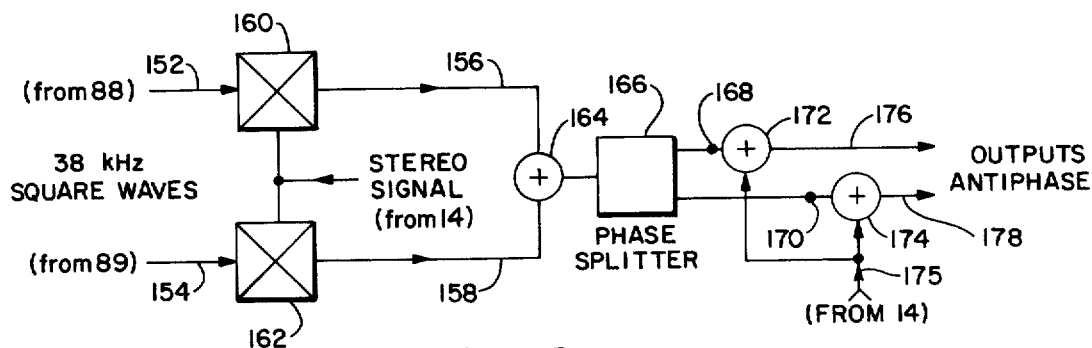
FIG. 8 illustrates an alternative output circuit which employs two level demodulators and eliminates third harmonic response.

In FIG. 8, an alternate embodiment is shown wherein either of the two pairs of 38 kHz waveforms 140, 142 or 146, 148 are used as the drive signals applied to the first set of input terminals 152 and 154 of the two-level multipliers 160 and 162. The composite stereo signal obtained from FM detector 14 provides the second input signal to each of two-level multipliers 160 and 162. The aforementioned pair of drive signals multiply the composite stereo signal and the products appear at the output terminals 156 and 158 of the two-level multipliers 160 and 162. The signals at terminals 156 and 158 are applied to the inputs of summer 164. The output from summer 164, containing the subchannel information, is applied to the input of phase splitter 166. The outputs of phase splitter 166, comprising the differential subchannel signals, (L − R) and − (L − R), are applied to input terminals 168 and 170 of summers 172 and 174, respectively. Also composite stereo signals from FM detector 14 are applied to the second pair of input terminals of summers 172 and 174. The resultant signals appearing at the output terminals 176 and 178 are the recovered left and right stereo channels, which can be amplified by amplifiers 17 and 20.

The function of multipliers 160 and 162, as in prior art demodulating systems, is to detect the subchannel difference information. Because the drive waveforms at terminals 152 and 154, of FIG. 8, both have third harmonic components, the undesired information in the region of 114 kHz will also be detected. These undesired signals will appear along with the desired difference signal in the outputs of multipliers 160 and 162 at output terminals 156 and 158, respectively. By making the phase relationship between the third harmonic components at input terminals 152 and 154 to multipliers 160 and 162 antiphase, then the detected undesired signals at terminals 156 and 158 will also be antiphase. These antiphase undesired signals are summed to zero in summer 164. Alternately, the application of antiphase 33⅓ percent duty cycle drive waveforms at input terminals 152 and 154 of multipliers 160 and 162 will generate in phase undesired demodulated signals in the outputs at terminals 156 and 158, respectively. These in phase signals may be subtracted to zero by appropriate modification of the function of summer 164. With either type of the drive waveforms mentioned above, the desired (L − R) difference channel appears in correct phase relationship at input terminals 156 and 158 of summer 164 so that it is transferred through the summer to its output terminal. The output of summer 164 drives phase splitter 166 which produces an inverted and noninverted output, i.e., a (L − R) difference signal and a − (L − R) inverted difference signal. These signals may be combined in summers 172 and 174 with the composite stereo signal from source 14 in the manner previously described for the circuitry of FIG. 5.

What has been described, therefore, is a plurality of methods and systems for generating multi-level decoding signals which have substantially no third harmonic content. Since the system of the invention utilizes switching techniques, immunity is provided against amplitude changes of the switching signal which otherwise could result in a degradation of the signal-to-noise ratio. The utilization of switching techniques further enables ease of manufacture of the subject system in integrated circuit form because these techniques provide greater freedom from device parameters than linear techniques would provide.

Since rectangular waves are used throughout the methods and systems of the invention, the resulting multi-level stereo decoding signals are substantially free of third harmonic components. Moreover, the circuits required to implement the system functions described above can readily be provided in integrated circuit form thereby making the disclosed system and method feasible for incorporation in relatively low cost equipment.

It is contemplated after having read the description of the preferred embodiments, those skilled in the art may foresee certain alterations and modifications which have not been pointed out with the particularity herein. Accordingly, this disclosure is intended to be in the nature of an explanatory illustration only and it is in no way to be considered as limiting. Therefore, the appended claims are to be interpreted as covering all modifications which fall within the true spirit and scope of the invention.

I claim:

1. A signal generator system for providing stereo decoding signals, including in combination:

oscillator means for providing an output signal at an output terminal thereof which has a repetition rate that is a first predetermined multiple of the repetition rate of a stereo decoding signal;

shift register means having an input terminal and a plurality of output terminals, said input terminal being connected to said output terminal of said oscillator means, said shift register means dividing said repetition rate of said oscillator output signal by a second predetermined multiple to provide output signals at said output terminals thereof, said output signals having a predetermined phase relation with respect to each other;

first circuit means responsive to selected ones of said output signals from said shift register means for providing at respective output terminals a first output signal having a repetition rate of said stereo decoding signal and a second output signal having a repetition rate of said stereo decoding signal, said second output signal having a predetermined phase relationship to said first output signal; and second circuit means for combining said first and second output signals from said first circuit means so that a stereo decoding signal is produced which has substantially no third harmonic components.

2. The signal generator system of claim 1 wherein said oscillator means is a signal controlled oscillator having a control terminal.

3. The signal generator system of claim 1 wherein said shift register means includes a binary divider means.

4. The signal generator system of claim 1 wherein said first circuit means includes in combination:

first gate means having input terminals and an output terminal, said input terminals of said first gate means being connected to selected output terminals of said shift register means; and second gate means having input terminals and an output terminal, said input terminals of said second gate means being connected to other selected output terminals of said shift register means.

5. The signal generator system of claim 4 wherein said second circuit means includes:

subtractor means haivng first and second input terminals and an output terminal, said first input terminal of said subtractor means being connected to said output terminal of said first gate means, said second input terminal of said subtractor means being connected to said output terminal of said second gate means, said subtractor means providing a multi-level stereo decoding signal at said output terminal thereof.

6. The signal generator system of claim 4 wherein said second circuit means includes:

summer means having first and second input terminals and an output terminal, said first input terminal of said summer means being connected to said output terminal of said first gate means, said second input terminal of said summer means being connected to said output terminal of said second gate means, said summer means providing a multi-level stereo decoding signal at said output terminal thereof.

7. The signal generator system of claim 4 wherein said second circuit means includes:

first multiplier means having first and second input terminals and an output terminal, said first input terminal of said first multiplier means being connected to said output terminal of said first gate means, said second input terminal of said first multiplier means being adapted to receive a composite stereo signal;

second multiplier means having first and second input terminals and an output terminal, said first input terminal of said second multiplier means being connected to said output terminal of said second gate means, said second input terminal of said second multiplier means being adapted to receive the composite stereo signal;

combiner means having first and second input terminals and an output terminal, said first input terminal of said combiner means being connected to said output terminal of said first multiplier means, said second input terminal of said combiner means being connected to said output terminal of said second multiplier means; and phase splitter means having an input terminal and first and second output terminals, said input terminal of said phase splitter means being connected to said output terminal of said signal combiner means, said phase splitter providing the subchannel and inverted subchannel signals at said output terminals thereof.

* * * * *